US012795284B2

(12) United States Patent
Stidsen et al.

(10) Patent No.: US 12,795,284 B2
(45) Date of Patent: Nov. 10, 2026

(54) WIRELESS HIGH-RESOLUTION HEADPHONES

(71) Applicant: Lenbrook Industries Limited, Pickering (CA)

(72) Inventors: Gregory R. Stidsen, Andover, MA (US); Jens Torben Sonderskov, Toronto (CA)

(73) Assignee: Lenbrook Industries Limited, Pickering (CA)

( * ) Notice: Subject to any disclaimer, the term of this patent is extended or adjusted under 35 U.S.C. 154(b) by 233 days.

(21) Appl. No.: 18/192,425

(22) Filed: Mar. 29, 2023

(65) Prior Publication Data

US 2023/0319454 A1 Oct. 5, 2023

Related U.S. Application Data

(60) Provisional application No. 63/325,892, filed on Mar. 31, 2022.

(51) Int. Cl.

*H04R 1/10* (2026.01)
*H03F 3/183* (2006.01)

(Continued)

(52) U.S. Cl.

CPC ......... *H04R 1/1041* (2013.01); *H04R 1/1008* (2013.01); *H04R 1/1025* (2013.01);

(Continued)

(58) Field of Classification Search

CPC .. H04R 1/1041; H04R 1/1008; H04R 1/1025; H04R 1/105; H04R 1/1058;

(Continued)

(56) References Cited

U.S. PATENT DOCUMENTS 10,070,225 B1 9/2018 Mitchell
10,680,884 B2 6/2020 Koss et al.

(Continued)

FOREIGN PATENT DOCUMENTS

CA 2720785 A1 * 10/2009 ............. H04H 20/95

OTHER PUBLICATIONS

Anonymous. "Philips PH802 Wireless Bluetooth Over-Ear Headphones," Amazon.com, accessed online via <www.amazon.com/Philips-Audio-Performance-PH802BK-Headphones/dp/B07ZDM5H9T/ref=sr_1_38?crid=2R307H2ZAYDST&keywords=Hi-res%2Bheadphones%2Bwireless&qid=1685710370&sprefix=hi-res%2Bheadphones%2Bwireless%2Caps%2C200&sr=8-38&th=1, Jul. 10, 2023.

(Continued)

*Primary Examiner* — Andrew Sniezek

(74) *Attorney, Agent, or Firm* — Foley Hoag LLP; Erik A. Huestis; Emily H. Yasharpour

(57) ABSTRACT

A wireless high-resolution headphones device includes a first earpiece containing a first speaker and a second earpiece containing a second speaker. The device also includes a first wireless transceiver unit operates at a first bandwidth to communicate with an external user device to receive control and/or configuration signals from the external user device. A second wireless transceiver unit operates at a second bandwidth greater than the first bandwidth to communicate with a media source remote from the headphones device to receive high-resolution audio content from the media source. A processor receives and processes the high-resolution audio content to generate audio output signals. The processor also receives and processes the control and/or configuration signals to control operation of and configure the headphones device. Audio amplifiers amplify the audio (Continued)

output signals to drive the first and second speakers to render an audio output. A rechargeable battery powers the device.

27 Claims, 6 Drawing Sheets

(51) Int. Cl.
*H04R 1/1025* (2026.01)
*H04W 88/06* (2009.01)

(52) U.S. Cl.
CPC ........... *H04R 1/105* (2013.01); *H04R 1/1058* (2013.01); *H03F 3/183* (2013.01); *H03F 2200/03* (2013.01); *H04R 2201/028* (2013.01); *H04R 2420/07* (2013.01); *H04W 88/06* (2013.01)

(58) Field of Classification Search
CPC .......... H04R 2201/028; H04R 2420/07; H03F 3/183; H03F 2200/03; H04W 88/06
See application file for complete search history.

(56) References Cited

U.S. PATENT DOCUMENTS

| | | | |
|---|---|---|---|
| 10,856,059 | B1 | 12/2020 | Koss et al. |
| 11,973,257 | B2 * | 4/2024 | Woods, Jr. ............. H01Q 21/10 |
| 2017/0230744 | A1 * | 8/2017 | Schrader .......... G10K 11/17855 |
| 2018/0270753 | A1 | 9/2018 | Recker et al. |
| 2018/0277123 | A1 | 9/2018 | Boesen et al. |
| 2021/0168506 | A1 | 6/2021 | Degner et al. |
| 2021/0335370 | A1 * | 10/2021 | Feng ..................... G10L 19/012 |

OTHER PUBLICATIONS

International Search Report and Written Opinion for International Application No. PCT/US2023/016729 dated Jun. 13, 2023.

Johnson, "UWB boots HD audio standard," EE Times, accessed online via <http://www.eetimes.com/showArticle.jhtml?>, XP002539784, Jan. 2, 2008.

Mishra et al., "System on Chip Interfaces for Low Power Design," In: System on Chip Interfaces for Low Power Design, Morgan Kaufmann, XP055408128 (2015).

* cited by examiner

WIRELESS HIGH-RESOLUTION HEADPHONES

CROSS-REFERENCE TO RELATED APPLICATIONS

This application claims the benefit of U.S. Provisional Application No. 63/325,892 filed Mar. 31, 2022, which is hereby incorporated by reference in its entirety.

BACKGROUND

Consumers have had limited accessibility to high-resolution digital audio (audio files with greater than 48 kHz sample rate or higher than 16-bit audio bit depth). Lenbrook Industries Limited (owner of NAD Electronics and Bluesound Music Systems and the applicant of the present application) began development of a new type of high-resolution media audio playback system in 2004 and demonstrated such a system in 2009. By 2011, the NAD Masters Digital Suite Home Sound System enabled consumers to experience music via one or more networked playback devices. The system's BluOS™ operating system was expanded to more affordable devices with the introduction of the Bluesound brand in 2012. Through a software control application installed on a controller (e.g., IR remote, wall mounted controller, smartphone, tablet, computer, voice input device), consumers can play what they desire in any room having a networked playback device. They can access high-resolution music files by each room with a playback device and group rooms together for synchronous playback of the same music. The BluOS™ modular software design also allows the unification of audio video receiver (AVR) devices, reducing the cost of software development compared to highly proprietary MCU/DSP software currently used throughout the AVR industry.

The present application relates generally to stereo headphones used for playback of high-resolution audio content from online music streaming services.

BRIEF SUMMARY OF THE DISCLOSURE

A wireless high-resolution headphones device is disclosed in accordance with one or more embodiments. The headphones device includes a first earpiece containing a first speaker and a second earpiece containing a second speaker. The device also includes a first wireless transceiver unit configured to operate at a first bandwidth to communicate with an external user device to receive control and/or configuration signals from the external user device. A second wireless transceiver unit in the device is configured to operate at a second bandwidth greater than the first bandwidth to communicate with a media source remote from the headphones device to receive high-resolution audio content from the media source. At least one processor in the device is configured to receive and process the high-resolution audio content received by the second wireless transceiver unit to generate audio output signals. The at least one processor is also configured to receive and process the control and/or configuration signals received by the second wireless transceiver unit to control operation of and configure the headphones device. One or more audio amplifiers in the device amplify the audio output signals to drive the first and second speakers to render an audio output. A rechargeable battery is also included for powering components of the headphones device.

In various embodiments, the first wireless transceiver unit is a short-range transceiver unit. In various embodiments, the first wireless transceiver unit is a Bluetooth transceiver unit. In various embodiments, the second wireless transceiver unit is a long-range transceiver unit. In various embodiments, the second wireless transceiver unit is a wireless cellular transceiver unit. In various embodiments, the wireless high-resolution headphones device includes a headband connecting the first and second ear pieces. In various embodiments, the media source communicates with the second wireless transceiver unit through a cellular connection having a transmission speed of at least 8 Mbps. In various embodiments, the media source communicates with the second wireless transceiver unit through a cellular connection having a transmission speed of 8-16 Mbps. In various embodiments, the at least one processor includes an ARM processor. In various embodiments, the wireless high-resolution headphones device includes a headband connecting the first earpiece and the second earpiece, and wherein the first wireless transceiver unit, the second wireless transceiver unit, the one or more audio amplifiers, and the at least one processor are mounted on a common circuit board in the first earpiece. In various embodiments, the rechargeable battery is mounted in the second earpiece. In various embodiments, the wireless high-resolution headphones device includes a flash memory and/or a random access memory readable by the at least one processor. In various embodiments, the external user device comprises a smartphone, a wearable device, a tablet computer, a laptop, or a desktop. In various embodiments, the wearable device is a smart watch. In various embodiments, the media source comprises a high resolution audio streaming server. In various embodiments, the high-resolution audio content comprises audio content sampled at a rate of at least 48 kHz. In various embodiments, the high-resolution audio content comprises audio content sampled at a rate of at least 96 kHz. In various embodiments, the second wireless transceiver unit has a standardized SDIO digital connection port for direct connection to a corresponding SDIO digital connection port on the at least one processor.

In accordance with one or more further embodiments, a method is disclosed for playing high-resolution audio on a wireless headphones device. The method includes (a) processing control and/or configuration signals received from an external user device at a first wireless transceiver unit in the headphones device to control operation of and configure the headphones device, said first wireless transceiver unit configured to operate at a first bandwidth; (b) processing high-resolution audio content received from an online media source at a second wireless transceiver unit to generate audio output signals, said second wireless transceiver unit configured to operate at a second bandwidth greater than the first bandwidth; and (c) amplifying the audio output signals to drive first and second speakers in the headphones device to render an audio output.

In various embodiments, the first wireless transceiver unit is a short-range transceiver unit. In various embodiments, the first wireless transceiver unit is a Bluetooth transceiver unit. In various embodiments, the second wireless transceiver unit is a long-range transceiver unit. In various embodiments, the second wireless transceiver unit is a wireless cellular transceiver unit. In various embodiments, the media source communicates with the second wireless transceiver unit through a cellular connection having a transmission speed of at least 8 Mbps. In various embodiments, the media source communicates with the second wireless transceiver unit through a cellular connection having a transmission speed of 8-16 Mbps. In various embodiments, the external user device comprises a smartphone, a wearable device, a tablet computer, a laptop, or a desktop. In various embodiments, the wearable device is a smart watch. In various embodiments, the online media source comprises a high resolution audio streaming server. In various embodiments, the high-resolution audio content comprises audio content sampled at a rate of at least 96 kHz.

In accordance with one or more embodiments, a wireless high-resolution headphones device is disclosed. The headphones device includes a first earpiece containing a first speaker and a second earpiece containing a second speaker. An ultra-wide band (UWB) wireless transceiver unit in the first earpiece or the second earpiece is configured to communicate with an external user device to receive high-resolution audio content and control and/or configuration signals from the external user device. At least one processor in the first earpiece or the second earpiece is configured to receive and process the high-resolution audio content received by the UWB wireless transceiver unit to generate audio output signals. The at least one processor is also configured to receive and process the control and/or configuration signals received by the UWB wireless transceiver unit to control operation of and configure the headphones device. The device also includes one or more audio amplifiers in the first earpiece or the second earpiece for amplifying the audio output signals to drive the first and second speakers to render an audio output. A rechargeable battery powers components of the headphones device.

In various embodiments, the external user device is a mobile phone or a computer.

BRIEF DESCRIPTION OF THE DRAWINGS

Like or identical reference numbers are used to identify common or similar elements.

DETAILED DESCRIPTION

Various embodiments disclosed herein relate to cellular-enabled stereo headphones used for playback of high-resolution (Hi-Res) audio content from online media streaming services.

Figure 1:
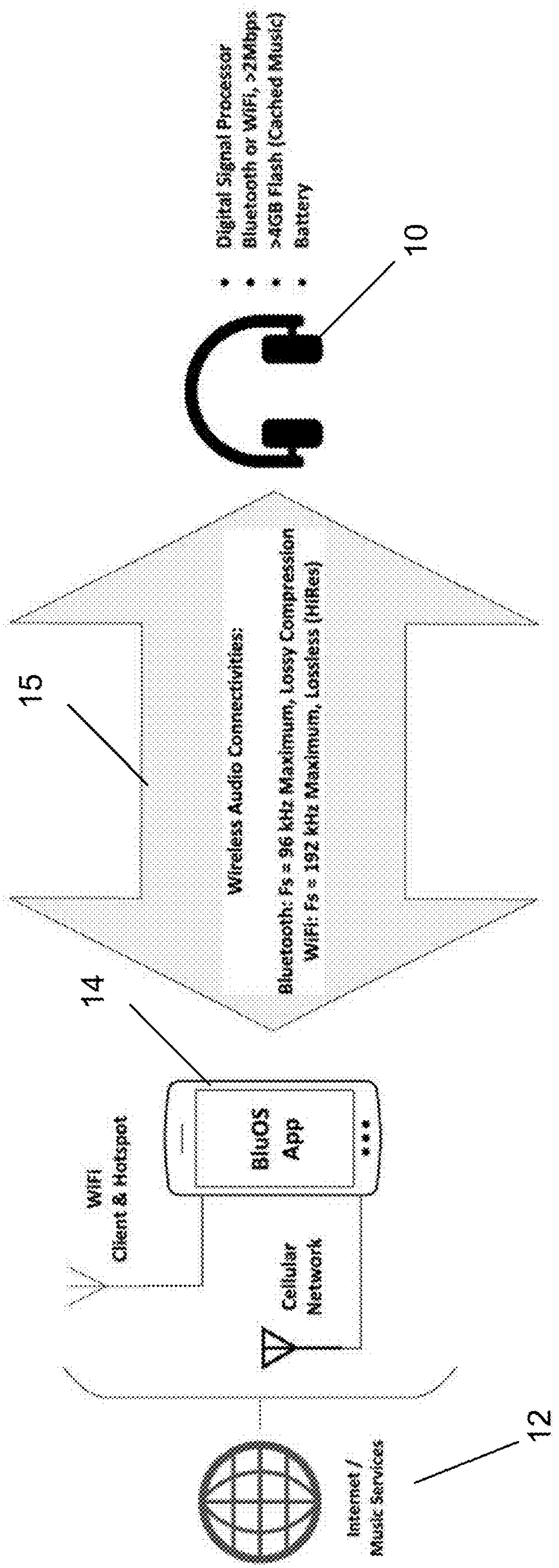
FIG. 1 illustrates a process for transmitting audio content from an online music service to wireless headphones via a mobile phone.

FIG. 1 illustrates a process of receiving audio content at wireless headphones 10 from an Internet music service 12. In various embodiments, audio content may include music content from one or more databases, libraries, and online streaming services such as Spotify™, iTunes™, Apple Music™, Amazon Music™, YouTube™, Google Play™, and/or the like. In various embodiments, internet music service 12 may be a subscription or free service. In various embodiments, any audio content as described herein may be music and/or radio or spoken word content. In various embodiment, audio content may be audiobooks or the like. Audio content from the music service 12 may first be received by a mobile phone 14, such as an iOS™/Android™ mobile phone, via a cellular, WiFi, or other network. In various embodiments, audio content may be received solely via a first network, such as by a cellular network alone or by a WiFi network alone. In various embodiments, audio content may be received via both a first network and a second network, such as via a cellular and a WiFi network simultaneously or in tandem. For example and without limitation, a first portion of audio content may be received via a first network, such as a cellular network, and a second portion of the audio content may be received via a second network, such as a WiFi network. In various embodiments, audio content may be received in discrete amounts, such as one song at a time. In various embodiments, receiving audio content may include receiving audio content continuously. In various embodiments, receiving audio content may include receiving more than one portion of the audio content at a time, such as more than one song at a time. In such embodiments, one portion of the audio content, such as a first song, may be played instantly and other portion(s) of the audio content may be temporarily stored in one or more storage mediums. In various embodiments, the wireless high-resolution headphones device, described herein, may include a flash memory and/or a random access memory readable by the at least one processor. The audio content may then be transmitted through a wireless Bluetooth connection 15 from the mobile phone 14 to the headphones 10 for audio playback. In various embodiments, Bluetooth connection 15 may connect more than one device to mobile phone 14 and headphones 10, such as connecting one or more speakers simultaneously to mobile phone 14 and headphones 10. In various embodiments, Bluetooth connection 15 may connect headphones 10 to one or more external user devices such as a smartphone, a tablet computer, a laptop, and/or a desktop. In various embodiments, Bluetooth connection 15 may connect headphones 10 to one or more external user devices such as a wearable device, which may include devices such as a smart watch, heartbeat monitor, fitness wearable device, Apple Watch™, Jawbone™, Fitbit™, and/or the like.

In various embodiments, headphones 10 may include at least one processor such as a digital signal processor. In various embodiments, the at least one processor may include an ARM processor.

In various embodiments, headphones 10 may include one or more batteries, such as a rechargeable Lithium Ion battery. In various embodiments, the one or more batteries may be mounted in either or both of the first and the second earpiece. In various embodiments, headphones 10 may include one or more components configured to receive and retain one or more disposable batteries, such as A, AA, AAA, C, D and/or 9V batteries. In various embodiments, headphones 10 may include one or more transceiver units. In various embodiments, a first wireless transceiver unit, that may be included in headphones 10, is a short-range transceiver unit. In various embodiments, the first wireless transceiver unit, that may be included in headphones 10, is a Bluetooth transceiver unit. In various embodiments, the second wireless transceiver unit, that may be included in headphones 10, is a long-range transceiver unit. In various embodiments, the second wireless transceiver unit, that may be included in headphones 10, is a wireless cellular transceiver unit. In various embodiments, headphones 10 may include a headband connecting the first and second ear pieces.

In various embodiments, the media source such as internet/music services 12 may communicate with the second wireless transceiver unit through a cellular connection having a minimum known transmission speed, such as a transmission speed of at least 8 Mbps. In various embodiments, the media source such as internet/music services 12 may communicate with the second wireless transceiver unit through a cellular connection having a range of known transmission speeds, such as transmission speeds of 8-16 Mbps.

In various embodiments, the wireless high-resolution headphones device, described herein, may include a headband connecting the first earpiece and the second earpiece. In various embodiments, the first wireless transceiver unit, the second wireless transceiver unit, the one or more audio amplifiers, and the at least one processor, as described herein, may be mounted on a common circuit board in the first earpiece. In various embodiments, portions or the entirety of the aforementioned components may be mounted on multiple separate and distinct circuit boards and communicatively and/or electrically connected. For example, a first portion of the components may be mounted on a first circuit board and a second portion of the components may be mounted on a second circuit board.

Figure 2:
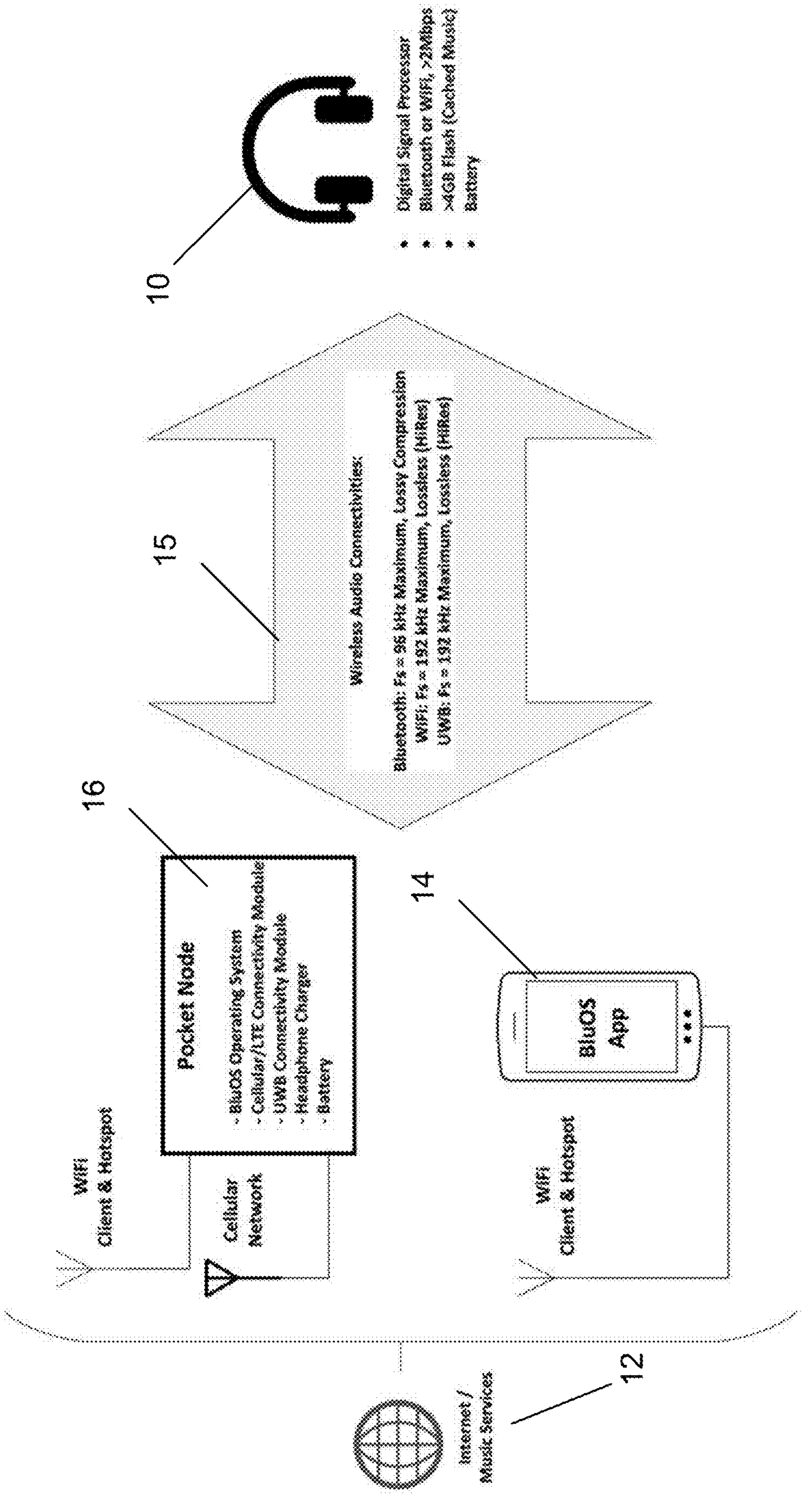
FIG. 2 illustrates a process for transmitting audio content from an online music service to wireless headphones via a pocket node device.

FIG. 2 illustrates another process of receiving audio content at wireless headphones 10 from an Internet music service 12. In addition to receiving the audio content from a mobile phone 14, or any external user device configured to receive audio content and include short-range connectivity, the audio content can also be received from a pocket node 16, which receives the content from the music service 12 via a cellular, WiFi, or other network. In various embodiments, the audio content received by the pocket node 16 may be received solely via a first network, such as by a cellular network alone or by a WiFi network alone. In various embodiments, audio content received by the pocket node 16 may be received via both a first network and a second network, such as via a cellular and a WiFi network simultaneously or in tandem. For example and without limitation, a first portion of audio content may be received by the pocket node 16 via a first network, such as a cellular network, and a second portion of the audio content may be received by the pocket node 16 via a second network, such as a WiFi network. In various embodiments, pocket node 16 may include one or more operating systems such as iOS™/Android™ and/or BluOS™. In various embodiments, pocket node 16 may include one or more cellular/Long Term Evolution (LTE) connectivity modules. In various embodiments, pocket node 16 may include one or more UWB connectivity modules. In various embodiments, pocket node 16 may include one or more batteries and/or one or more chargers configured to charge batteries and/or another portion of pocket node 16. The audio content may be transmitted through a wireless connection, such as a Bluetooth, WiFi, or UWB connection 15, to the headphones 10 for audio playback.

There may be fundamental limitations in the digital bandwidth available from the Bluetooth wireless connectivity standard. The digital bandwidth available for stereo audio transmission is approximately 1 to 2 Mbps. While this may be sufficient bandwidth for transmitting standard-definition stereo audio data that has been compressed with standard codec software (e.g., AAC, SBC, or aptX), this compression typically introduces acoustic artifacts that reduce the perceived audio quality presented by the headphones. Additionally, higher codec compression ratios may be needed for newer Hi-Res audio formats intended to provide audio quality beyond traditional standard-definition or 'CD-quality' audio. The higher codec compression ratios create even more acoustic artifacts, eliminating any advantage offered by the higher audio sample rates and bit depths of Hi-Res audio source formats. The impact of this fundamental bandwidth limitation has become well-known in the headphone industry, as consumers are preparing to purchase premium headphones to enjoy Hi-Res music being offered by popular music services such as Amazon™, Apple™, Tidal™, and Qobuz™. A need exists for an improved wireless digital connection between high-quality headphones and music sources.

Figure 3:
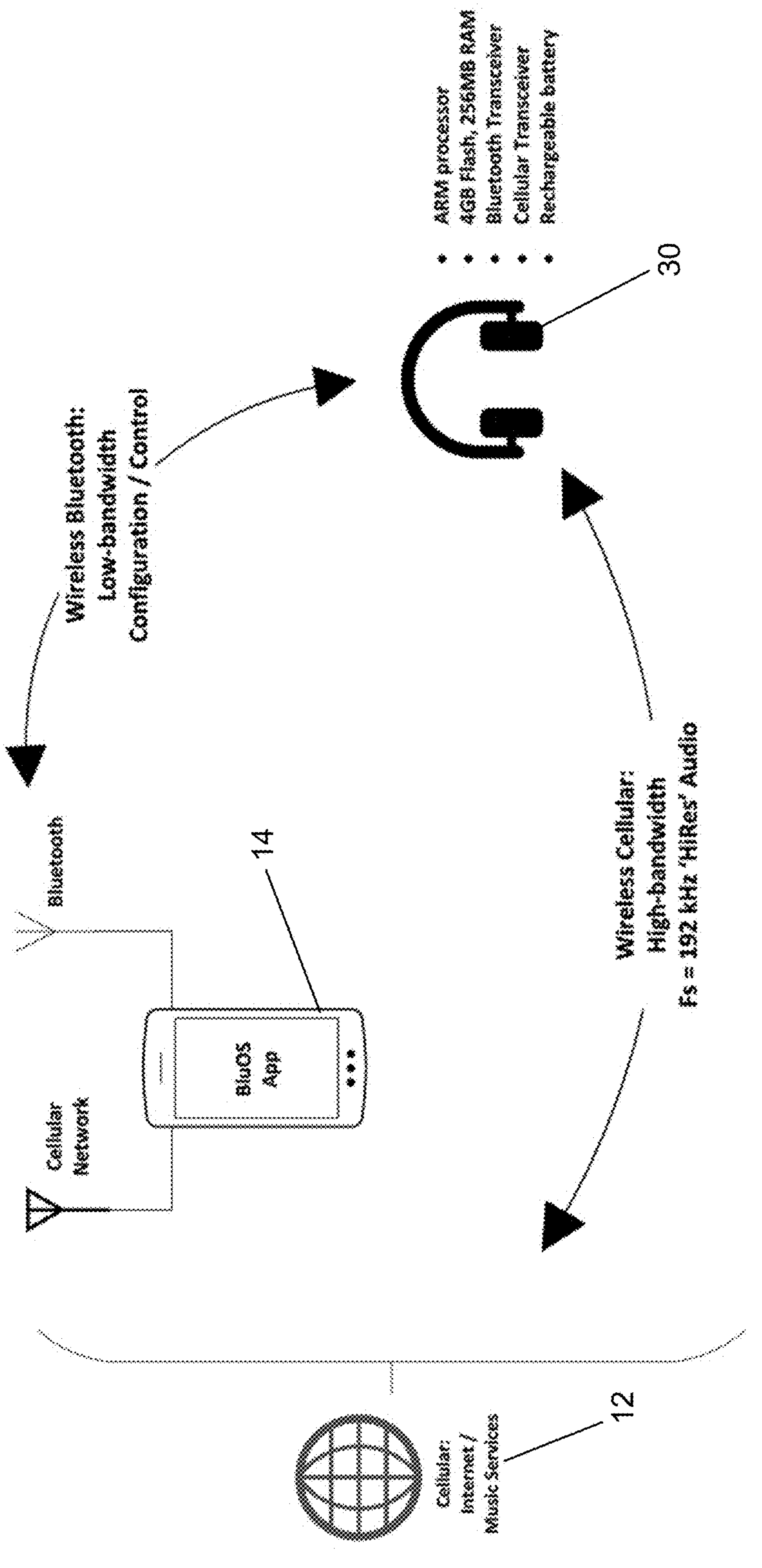
FIG. 3 illustrates an exemplary process for transmitting audio content from an online music service to wireless headphones in accordance with one or more embodiments.

FIG. 3 illustrates operation of exemplary cellular-enabled high-resolution headphones 30 in accordance with one or more embodiments. The headphones 30 eliminate the need for a mobile phone 14 or other device as an intermediate wireless connection between the headphones 30 and a music service 12 on the Internet. Modern wireless cellular transceiver technology (e.g., a 3G, 4G, or 5G transceiver) may be integrated directly into the headphones 30. This can overcome the digital bandwidth limitation posed by, for example, using Bluetooth to carry audio from the mobile phone 14 to the headphones 30. The significantly higher bandwidth offered by the cellular connection instead of Bluetooth eliminates the necessity for audio data compression codecs, thereby allowing the full digital bandwidth and Hi-Res music quality to be enjoyed by the user. Though a Bluetooth connection may still be used between the mobile phone 14 and the headphones 30, it may only be a low-bandwidth connection intended to support control and configuration settings of the cellular-enabled headphones 30 from the BluOS™ software app and/or other audio apps installed on the mobile phone that have implemented control functions compatible with the headphones 14. The actual audio stream data may pass directly from an online Hi-Res music service 12 to the headphones 30 through a wireless cellular connection. In various embodiments, headphones 30 may be in-ear headphones, over-the-ear headphones, wired-together headphones, such as in a configuration in which each headphone is connected to one another via a wire, tether, or device that may include one or more circuit boards described herein, or headphones integrated into a garment, such as a hat, or headphones integrated into a body apparatus, such as a helmet.

Figure 4:
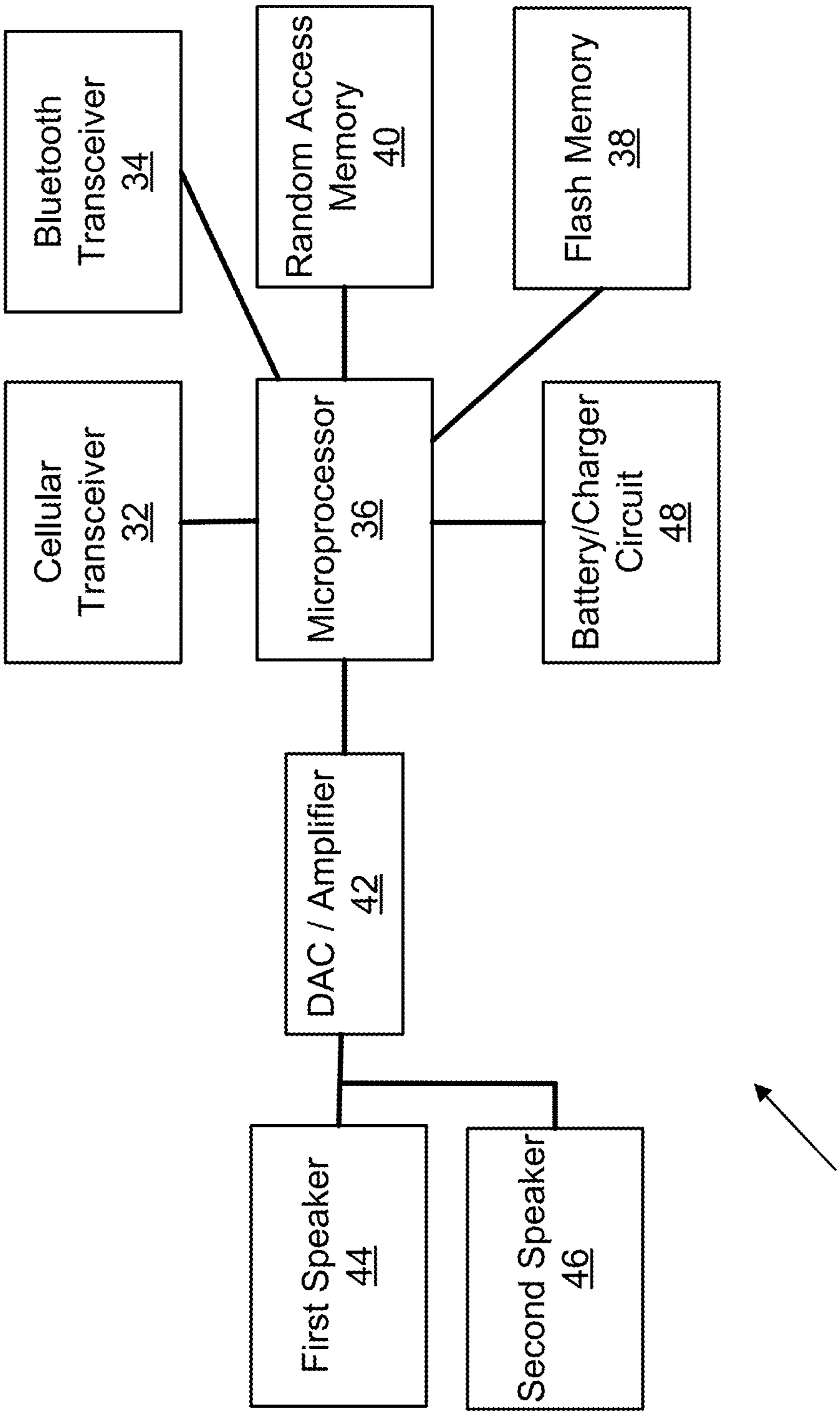
FIG. 4 is a block diagram illustrating select components of exemplary stereo headphones in accordance with one or more embodiments.

FIG. 4 is a simplified block diagram illustrating select components of exemplary cellular-enabled headphones 30 in accordance with one or more embodiments. The headphones 30 may include a long-range connectivity module, such as a wireless cellular connectivity module (e.g., a 3G, 4G, or 5G transceiver) 32, a short-range connectivity module (e.g., a Bluetooth transceiver) 34, a microprocessor (e.g., an ARM processor) 36, flash memory 38, RAM memory 40, and high-quality digital audio power amplifier 42 for driving speakers 44, 46. In one or more embodiments, these components may be mounted on a common circuit board that is located in the earpiece assembly (containing speaker 44) on one side of the headphones 30. In various embodiments, portions or the entirety of the aforementioned components may be mounted on multiple separate and distinct circuit boards and communicatively and/or electrically connected. For example, a first portion of the components, such as long-range transceiver unit 32 and short-range transceiver unit 34, may be mounted on a first circuit board and a second portion of the components may be mounted on a second circuit board. In such embodiments, the circuit boards may be stacked and mounted to one another. The earpiece assembly, containing a second speaker 46, on the other side of the headphones can include a rechargeable battery and/or charger circuit 48, such as a lithium battery and charger circuitry. In various embodiments, each earpiece assembly may include a distinct battery configured to alternatively or simultaneously power the components of headphones 30. In various embodiments, any component, described herein, or combination of components may be disposed in either of the two earpieces. For example, and without limitation, a first earpiece may contain long-range connectivity module 32 and a second earpiece may include the short-range connectivity module 34. In various embodiments, headphones 30 may be in-ear headphones, over-the-ear headphones, wired-together headphones, such as in a configuration in which each headphone is connected to one another via a wire, tether, or device that may include one or more circuit boards described herein, or headphones integrated into a garment, such as a hat, or headphones integrated into a body apparatus, such as a helmet.

The cellular connectivity module 32 may include specialized digital radiofrequency transceivers for connection to the cellular network. At its 'baseband' connection port, the cellular connectivity module 32 may include a standardized SDIO digital connection port for direct connection to a corresponding SDIO digital connection port on the ARM microprocessor 36. In one or more embodiments, the ARM microprocessor 36, RAM 40, and flash memory 38 may support boot and execution of an operating system, e.g., the BluOS™ operating system available from Lenbrook. BluOS™ includes software drivers for initializing the cellular connectivity module with user account information required to authenticate the headphone system with local cellular networks. BluOS™ also supports real-time Hi-Res audio decoder software components capable of decoding the latest Hi-Res audio formats offered by music streaming services such as MQA™, OraStream™, and Apple™. Although cellular wireless transceivers are associated with high power consumption requiring larger batteries not normally associated with headphones, recent silicon chipsets implementing 3G, 4G and 5G cellular standards have been designed to substantially reduce the power and thus size of battery needed to support mobile headphone applications. The Bluetooth transceiver 34 may also be hosted by BluOS™ software. This allows Bluetooth 'pairing' between the mobile phone 14 and the headphones 30 for a low-bandwidth connection enabling a control and configuration channel between the BluOS™ apps installed on the customer's phone 14. Bluetooth may also be paired with other user devices including wearable devices such as smart watches to provide a convenient user control and configuration interface for the headphones 30.

Figure 5:
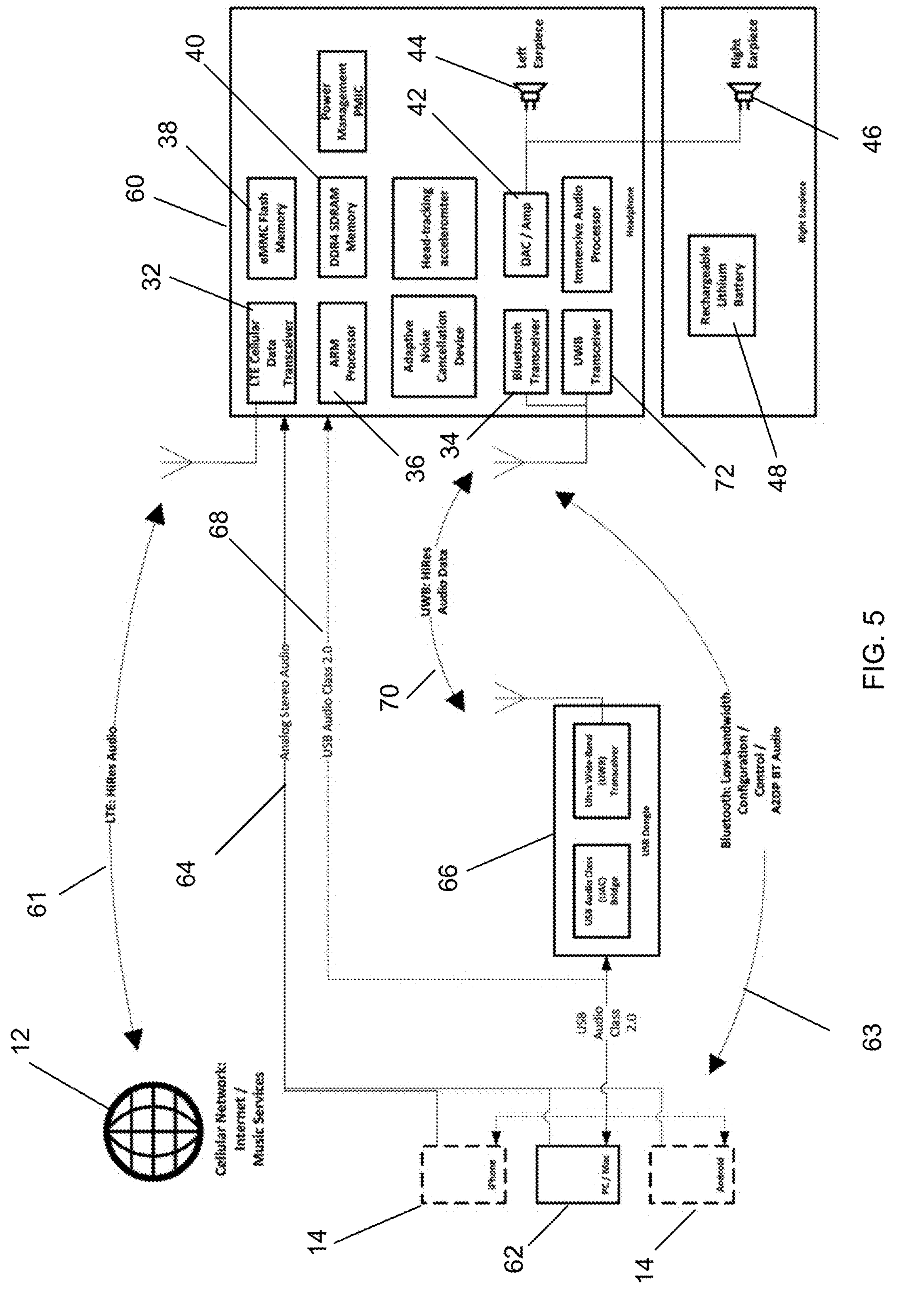
FIG. 5 illustrates an exemplary system for transmitting audio content from an online music service to wireless headphones in accordance with further embodiments.

FIG. 5 illustrates operation of exemplary cellular-enabled high-resolution headphones device 60 in accordance with one or more further alternate embodiments.

In one or more embodiments, the headphones device 60 may include an integrated long-range connectivity module, such as wireless cellular transceiver 32, to provide a cellular connection 61 with a music service 12 on the Internet. In various embodiments, cellular connection 61 may include an LTE connection configured to transmit High Resolution (HiRes) audio content. A Bluetooth connection 63 may be used between a mobile phone 14, any external user device as described herein, or a combination thereof, or a personal computer 62 and the headphones device 60 to support control and configuration settings of the headphones device 60 from software apps installed on the mobile phone 14, any external user device as described herein, or personal computer 62. The headphones device 60 may include a long-range connectivity module, such as a wireless cellular connectivity module (e.g., a 3G, 4G, or 5G transceiver) 32, a short-range connectivity module (e.g., a Bluetooth transceiver) 34, a microprocessor (e.g., an ARM processor) 36, flash memory 38, RAM memory 40, and high-quality digital audio power amplifier 42 for driving speakers 44, 46. In one or more embodiments, these components may be mounted on a common circuit board that is located in the earpiece assembly (containing speaker 44) on one side of the headphones device 60. In various embodiments, flash memory 38 may be a NOR or NAND flash memory, such as an eMMC and/or SSD flash memory. In various embodiments, RAM memory 40 may be dynamic RAM, a static RAM, and/or a synchronous dynamic RAM memory.

In various embodiments, headphones device 60 may include a Power Management PMIC unit. In various embodiments, headphones device 60 may include one or more Adaptive Noise Cancellation device disposed therein. In various embodiments, the Adaptive Noise Cancellation device may include one or more microphones and speakers configured to analyze outside noise and produce sound to destructively interfere with said outside noise. In various embodiments, headphones device 60 may include one or more head-tracking accelerometers disposed therein. In various embodiments, the head-tracking accelerometers may be configured to detect and measure the position of the headphones device 60 relative or attached to a user's head. In various embodiments, head-tracking accelerometers may provide said detection and/or measurements of head position to one or more other components to adjust at least one parameter of the audio playback or another aspect of the headphones device 60 operation based on the head position. In various embodiments, headphones device 60 may include one or more immersive audio processors. The immersive audio processors may spatially adjust the output of the earpiece speakers of headphones device 60. Immersive audio processors may be electrically and/or communicatively connected to each of the other components described herein.

In one or more further embodiments, the headphones device 60 can optionally also be connected to the mobile phone 14 or the personal computer 62 by a high-bandwidth wired analog stereo connection 64 to receive the high-resolution audio content. In various embodiments, headphones device 60 may include an opening or port configured to facilitate said wired analog stereo connection 64.

In one or more further embodiments, the headphones device 60 can optionally also be connected to the personal computer 62 by a high-bandwidth wired USB Audio Class 2.0 connection 68 to receive the high-resolution audio content.

In one or more further embodiments, the personal computer 62 may be connected to a USB dongle 66, which may be configured to wirelessly transmit the high-resolution audio content to the headphones device 60 using high-bandwidth ultra-wide band (UWB) connection 70. USB dongle 66 may include a USB audio class (UAC) Bridge and/or an Ultra Wide-Band (UWB) transceiver disposed therein. In various embodiments the USB audio class (UAC) Bridge and/or an Ultra Wide-Band (UWB) transceiver may be mounted on one or more circuit boards communicatively and/or electrically connected thereto. The audio content may be received at the headphones device 60 at an integrated UWB transceiver 72. UWB is a short-range wireless communication method which can operate at radiofrequencies higher than the 5 GHz spectrum reserved for WiFi. UWB's radiofrequency modulation scheme periodically distributes the encoded digital information across the radiofrequency spectrum. UWB technology is advantageous in battery powered devices as it may consume substantially less energy than other short-range technologies such as Bluetooth, while it may support at least twice the data transmission bandwidth as Bluetooth.

In one or more further embodiments, the mobile phone 14 or computer 62 may include an integrated UWB module for wirelessly transmitting the high-resolution audio content to the headphones device 60 using a UWB connection.

In various embodiments, any component of headphones device 60, described herein, or combination of components may be disposed in either of the right or left earpieces. For example, and without limitation, the right earpiece may include a portion of the components and the left earpiece may include the remainder of the components. In various embodiments, the left and right earpieces may be configured to house a different type of component, for example and without limitation, the left earpiece may be configured to house each of the transceivers and memories, while the right earpiece may be configured to house each of the processors, accelerometers and battery/charging circuits. In various embodiments, as shown in FIG. 5, the left earpiece may house the transceivers, memories, power management devices, amplifier, processors and the like, and the right earpiece may be configured to house a rechargeable lithium battery. In various embodiments, each of the right and the left earpiece of headphones device 60 may be connected via one or more headbands configured to house at least one of the components here described. For example the headband may be configured to house the transceivers such as to locate the transceivers at the highest relative point of the headphones device 60. In various embodiments, headphones device 60 may have any opening disposed therein to house a port or connector for forming a wired connection, such as to a charger connected to a wall outlet. In various embodiments, headphones device 60 may be integrated into a garment, such as a hat, or headphones integrated into a body apparatus, such as a helmet.

Figure 6:
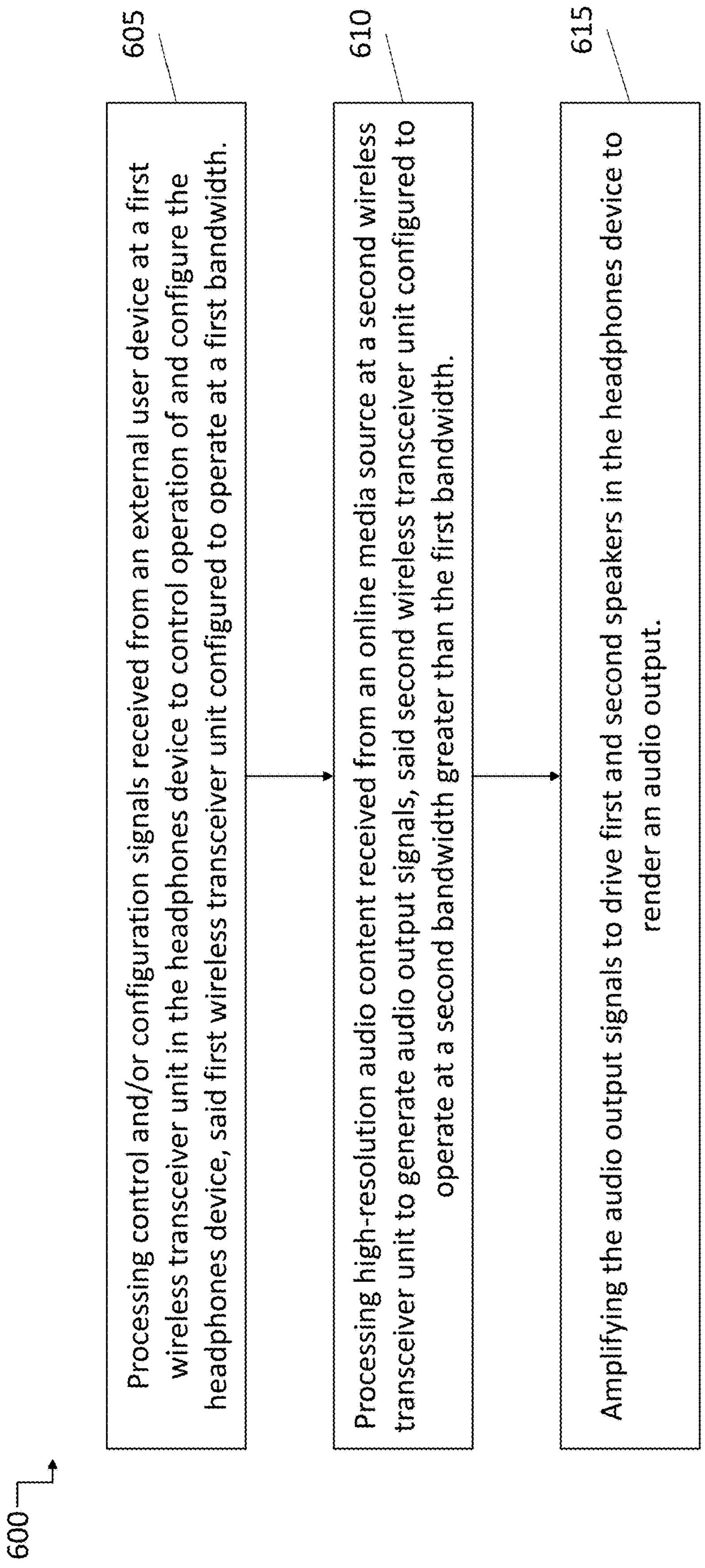
FIG. 6 illustrates an exemplary method for playing high-resolution audio on a wireless headphones device in accordance with further embodiments.

FIG. 6 illustrates an exemplary method for playing high-resolution audio on a wireless headphones device in accordance with further embodiments. At step 605, method 600 includes processing control and/or configuration signals received from an external user device at a first wireless transceiver unit in the headphones device to control operation of and configure the headphones device, said first wireless transceiver unit configured to operate at a first bandwidth.

At step 610, method 600 includes processing high-resolution audio content received from an online media source at a second wireless transceiver unit to generate audio output signals, said second wireless transceiver unit configured to operate at a second bandwidth greater than the first bandwidth.

At step 615, method 600 includes amplifying the audio output signals to drive first and second speakers in the headphones device to render an audio output. Each of the method steps described herein may be performed simultaneously, in a different temporal order, and/or in any number of iterations or steps.

Having thus described several illustrative embodiments, it is to be appreciated that various alterations, modifications, and improvements will readily occur to those skilled in the art. Such alterations, modifications, and improvements are intended to form a part of this disclosure, and are intended to be within the spirit and scope of this disclosure. While some examples presented herein involve specific combinations of functions or structural elements, it should be understood that those functions and elements may be combined in other ways according to the present disclosure to accomplish the same or different objectives. In particular, acts, elements, and features discussed in connection with one embodiment are not intended to be excluded from similar or other roles in other embodiments. Additionally, elements and components described herein may be further divided into additional components or joined together to form fewer components for performing the same functions.

Accordingly, the foregoing description and attached drawings are by way of example only, and are not intended to be limiting.

The invention claimed is:

1. A wireless high-resolution headphones device, comprising:

a first earpiece containing a first speaker;

a second earpiece containing a second speaker;

a first wireless transceiver unit configured to operate at a first bandwidth to communicate with an external user device to receive control and/or configuration signals from the external user device;

a second wireless transceiver unit configured to operate at a second bandwidth greater than the first bandwidth to communicate directly, without relay through any intermediate media source, with an audio streaming server remote from both the headphones device and the external user device to receive high-resolution audio content from the media source as a primary audio streaming pathway, wherein the first wireless transceiver unit maintains communication with the external user device while the second wireless transceiver unit receives the high-resolution audio content from the audio streaming server;

at least one processor configured to receive and process the high-resolution audio content received by the second wireless transceiver unit to generate audio output signals, the at least one processor also configured to receive and process the control and/or configuration signals received by the first wireless transceiver unit to control operation of and configure the headphones device;

one or more audio amplifiers for amplifying the audio output signals to drive the first and second speakers to render an audio output; and a rechargeable battery for powering components of the headphones device.

2. The wireless high-resolution headphones device of claim 1, wherein the first wireless transceiver unit is a short-range transceiver unit.

3. The wireless high-resolution headphones device of claim 1, wherein the first wireless transceiver unit is a Bluetooth transceiver unit.

4. The wireless high-resolution headphones device of claim 1, wherein the second wireless transceiver unit is a wireless cellular transceiver unit.

5. The wireless high-resolution headphones device of claim 1, further comprising a headband connecting the first and second ear pieces.

6. The wireless high-resolution headphones device of claim 1, wherein the media source communicates with the second wireless transceiver unit through a cellular connection having a transmission speed of at least 8 megabits per second (Mbps).

7. The wireless high-resolution headphones device of claim 1, wherein the media source communicates with the second wireless transceiver unit through a cellular connection having a transmission speed of 8-16 megabits per second (Mbps).

8. The wireless high-resolution headphones device of claim 1, wherein the at least one processor comprises an Advanced RISC Machine (ARM processor).

9. The wireless high-resolution headphones device of claim 1, further comprising a headband connecting the first earpiece and the second earpiece, and wherein the first wireless transceiver unit, the second wireless transceiver unit, the one or more audio amplifiers, and the at least one processor are mounted on a common circuit board in the first earpiece.

10. The wireless high-resolution headphones device of claim 9, wherein the rechargeable battery is mounted in the second earpiece.

11. The wireless high-resolution headphones device of claim 1, further comprising a flash memory and/or a random access memory readable by the at least one processor.

12. The wireless high-resolution headphones device of claim 1, wherein the external user device comprises a smartphone, a wearable device, a tablet computer, a laptop, or a desktop.

13. The wireless high-resolution headphones device of claim 12, wherein the wearable device is a smart watch.

14. The wireless high-resolution headphones device of claim 1, wherein the high-resolution audio content comprises audio content sampled at a rate of at least 48 kilohertz (kHz).

15. The wireless high-resolution headphones device of claim 1, wherein the high-resolution audio content comprises audio content sampled at a rate of at least 96 kilohertz (kHz).

16. The wireless high-resolution headphones device of claim 1, wherein the second wireless transceiver unit has a standardized Secure Digital Input Output (SDIO) digital connection port for direct connection to a corresponding SDIO digital connection port on the at least one processor.

17. A method of playing high-resolution audio on a wireless headphones device, comprising the steps of:

processing control and/or configuration signals received from an external user device at a first wireless transceiver unit in the headphones device to control operation of and configure the headphones device, said first wireless transceiver unit configured to operate at a first bandwidth;

processing high-resolution audio content received directly, without relay through any intermediate media source, from an audio streaming server, remote from both the headphones device and the external user device, at a second wireless transceiver unit to generate audio output signals, said second wireless transceiver unit configured to operate at a second bandwidth greater than the first bandwidth as a primary audio streaming pathway, wherein the first wireless transceiver unit and the second wireless transceiver unit operate simultaneously and the first wireless transceiver unit maintains communication with the external user device while the second wireless transceiver unit receives the high-resolution audio content from the audio streaming server; and amplifying the audio output signals to drive first and second speakers in the headphones device to render an audio output.

18. The method of claim 17, wherein the first wireless transceiver unit is a short-range transceiver unit.

19. The method of claim 17, wherein the first wireless transceiver unit is a Bluetooth transceiver unit.

20. The method of claim 17, wherein the second wireless transceiver unit is a wireless cellular transceiver unit.

21. The method of claim 17, wherein the media source communicates with the second wireless transceiver unit through a cellular connection having a transmission speed of at least 8 Mbps.

22. The method of claim 17, wherein the media source communicates with the second wireless transceiver unit through a cellular connection having a transmission speed of 8-16 megabits per second (Mbps).

23. The method of claim 17, wherein the external user device comprises a smartphone, a wearable device, a tablet computer, a laptop, or a desktop.

24. The method of claim 23, wherein the wearable device is a smart watch.

25. The method of claim 17, wherein the high-resolution audio content comprises audio content sampled at a rate of at least 96 kilohertz (kHz).

26. A wireless high-resolution headphones device, comprising:

a first earpiece containing a first speaker;

a second earpiece containing a second speaker;

an ultra-wide band (UWB) wireless transceiver unit in the first earpiece or the second earpiece configured to communicate with an external user device to receive control and/or configuration signals from the external user device;

a cellular data transceiver in the first earpiece or second earpiece configured to communicate directly, without relay through any intermediate media source, with an audio streaming server, remote from both the headphones device and the external user device, and to receive high resolution audio content as a primary audio streaming pathway, wherein the ultra-wide band (UWB) wireless transceiver unit and the cellular data transceiver operate simultaneously and the ultra-wide band (UWB) wireless transceiver unit maintains communication with the external user device while the ultra-wide band (UWB) receives the high-resolution audio content from the audio streaming server;

at least one processor in the first earpiece or the second earpiece configured to receive and process the high-resolution audio content received by the cellular data transceiver to generate audio output signals, the at least one processor also configured to receive and process the control and/or configuration signals received by the UWB wireless transceiver unit to control operation of and configure the headphones device;

one or more audio amplifiers in the first earpiece or the second earpiece for amplifying the audio output signals to drive the first and second speakers to render an audio output; and a rechargeable battery for powering components of the headphones device.

27. The wireless high-resolution headphones device of claim 26, wherein the external user device is a mobile phone or a computer.

* * * * *